US011258126B2

(12) United States Patent
Kwon et al.

(10) Patent No.: US 11,258,126 B2
(45) Date of Patent: Feb. 22, 2022

(54) BATTERY RACK

(71) Applicant: SK INNOVATION CO., LTD., Seoul (KR)

(72) Inventors: Dae Won Kwon, Daejeon (KR); Yong Uk Kim, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 13 days.

(21) Appl. No.: 16/394,718

(22) Filed: Apr. 25, 2019

(65) Prior Publication Data

US 2019/0334141 A1  Oct. 31, 2019

(30) Foreign Application Priority Data

Apr. 26, 2018  (KR) ........................ 10-2018-0048503

(51) Int. Cl.
| | |
|---|---|
| *H01M 50/20* | (2021.01) |
| *H05K 5/02* | (2006.01) |
| *H01M 10/647* | (2014.01) |
| *H01M 10/613* | (2014.01) |
| *H05K 7/20* | (2006.01) |

(52) U.S. Cl.
CPC ......... *H01M 50/20* (2021.01); *H01M 10/613* (2015.04); *H01M 10/647* (2015.04); *H05K 5/0213* (2013.01); *H05K 5/0217* (2013.01); *H05K 7/20* (2013.01)

(58) Field of Classification Search
CPC ............ H01M 2/1077; H01M 10/613; H01M 10/647; H01M 10/6557; H01M 10/625; H01M 10/6556; H01M 10/6551; H01M 10/6563; H01M 50/20; H05K 5/0213; H05K 5/0217; H05K 7/20
See application file for complete search history.

(56) References Cited

U.S. PATENT DOCUMENTS

| | | | |
|---|---|---|---|
| 9,425,444 B2 * | 8/2016 | Wagner | H01M 10/6563 |
| 9,748,548 B2 * | 8/2017 | Malcolm | H01M 10/6551 |
| 9,837,644 B2 * | 12/2017 | Wagner | H01M 10/6563 |
| 10,085,359 B2 * | 9/2018 | Kurosaki | H01M 10/627 |
| 10,147,984 B2 * | 12/2018 | O'Hora | H01M 10/6567 |
| 10,312,561 B2 * | 6/2019 | Park | H01M 2/20 |
| 10,326,180 B2 * | 6/2019 | Son | H01M 2/1077 |

(Continued)

FOREIGN PATENT DOCUMENTS

| | | | |
|---|---|---|---|
| JP | 2016029712 A | † | 3/2016 |
| KR | 20100100859 A | † | 9/2010 |

(Continued)

*Primary Examiner* — Patrick D Hawn
(74) *Attorney, Agent, or Firm* — IP & T Group LLP

(57) ABSTRACT

The present invention provides a battery rack including: a housing; a plurality of battery modules stacked in the housing; and a connection member configured to electrically connect the plurality of battery modules, wherein each of the plurality of battery modules includes a plurality of battery submodules stacked on each other, and each of the plurality of battery submodules comprises: at least one cooling member; and a plurality of battery cells located on both sides with the at least one cooling member interposed therebetween, wherein at least two of the plurality of battery cells are located on each of both sides of the at least one cooling member.

14 Claims, 15 Drawing Sheets

(56) References Cited

U.S. PATENT DOCUMENTS

| | | | | |
|---|---|---|---|---|
| 10,388,923 | B2* | 8/2019 | Takahashi | H01M 2/1077 |
| 10,497,996 | B1* | 12/2019 | Muniz | H01M 10/486 |
| 10,522,885 | B2* | 12/2019 | Kwon | H01M 2/206 |
| 10,615,465 | B2* | 4/2020 | Huff | H01M 10/441 |
| 10,811,645 | B2* | 10/2020 | Stojanovic | H01M 10/613 |
| 10,862,082 | B2* | 12/2020 | Lee | H01M 2/1016 |
| 2008/0160395 | A1* | 7/2008 | Okada | H01M 2/1083 |
| | | | | 429/99 |
| 2011/0059347 | A1* | 3/2011 | Lee | H01M 2/1077 |
| | | | | 429/120 |
| 2011/0200862 | A1* | 8/2011 | Kurosawa | H01M 10/653 |
| | | | | 429/120 |
| 2013/0183564 | A1* | 7/2013 | Wagner | H01M 10/6563 |
| | | | | 429/120 |
| 2013/0330587 | A1* | 12/2013 | Takahashi | H01M 10/663 |
| | | | | 429/99 |
| 2014/0057151 | A1* | 2/2014 | Chung | B60K 1/04 |
| | | | | 429/120 |
| 2014/0178721 | A1* | 6/2014 | Chung | H01M 10/425 |
| | | | | 429/71 |
| 2015/0283965 | A1* | 10/2015 | Lynds | H01M 10/6556 |
| | | | | 429/120 |
| 2017/0104247 | A1* | 4/2017 | Son | H01M 2/1077 |
| 2017/0187084 | A1* | 6/2017 | Park | H01M 2/1077 |
| 2017/0331164 | A1* | 11/2017 | Kwon | H01M 2/206 |
| 2017/0365888 | A1* | 12/2017 | Kwon | H01M 10/613 |
| 2017/0365894 | A1* | 12/2017 | Kwon | H01M 10/625 |
| 2017/0365897 | A1* | 12/2017 | Okada | H01M 10/425 |
| 2018/0190956 | A1* | 7/2018 | Lica | H01M 10/625 |
| 2018/0248238 | A1* | 8/2018 | Pinon | H01M 10/647 |
| 2019/0140229 | A1* | 5/2019 | Lindstrom | H01M 10/656 |
| 2019/0198951 | A1* | 6/2019 | Tong | H01M 10/658 |
| 2019/0296294 | A1* | 9/2019 | Hirschbeck | H01M 10/6556 |
| 2019/0334141 | A1* | 10/2019 | Kwon | H01M 10/613 |
| 2019/0334142 | A1* | 10/2019 | Kwon | H01M 2/348 |
| 2019/0334216 | A1* | 10/2019 | Kim | H01M 2/348 |
| 2019/0334343 | A1* | 10/2019 | Kim | G01R 31/50 |
| 2019/0379030 | A1* | 12/2019 | Golubkov | H01M 2/1077 |
| 2020/0127347 | A1* | 4/2020 | Waddell | H01M 2/1077 |

FOREIGN PATENT DOCUMENTS

| | | | |
|---|---|---|---|
| KR | 10-1278506 | | 7/2013 |
| KR | 20130137972 A | † | 12/2013 |
| KR | 20180006581 A | † | 1/2018 |

\* cited by examiner
† cited by third party

BATTERY RACK

CROSS-REFERENCE TO RELATED APPLICATION

This application claims priority to Korean Patent Applications No. 10-2018-0048503 filed on Apr. 26, 2018 in the Korean Intellectual Property Office (KIPO), the entire disclosure of which is incorporated by reference herein.

BACKGROUND OF THE INVENTION

1. Field of the Invention

Embodiments of the present invention relate to a battery rack.

2. Description of the Related Art

In general, it is necessary for an energy storage system (ESS) to have a long life in order to be used in a product for a long period time. However, when battery cells included in the battery rack are continuously exposed to a high temperature environment, the battery cells may be rapidly deteriorated, or safety problems such as ignition or explosion may occur.

In this regard, cooling fans are installed for each battery module provided in a conventional battery rack to cool the battery cells in the art. However, in this case, there are problems in that a large amount of energy is consumed and costs are increased, as well as, there is a limitation in cooling efficiency because it depends on simple air cooling by an outside air.

Meanwhile, in a case of the conventional battery rack, there is a limitation in the number of battery cells housed in each of a plurality of battery modules forming the battery rack, and there is also a limitation in improvements in an aspect of an energy density such as increasing the number of battery cells per unit volume.

As an example of the prior art, Korean Patent Registration No. 10-1278506, which is registered on Jun. 19, 2013, discloses a rack system of a battery module for energy storage, however, still has lack of improvement in the energy density and life-span properties.

SUMMARY OF THE INVENTION

It is an object of embodiments of the present invention to provide a battery rack capable of increasing cooling efficiency of a plurality of battery cells of each battery module housed in a housing.

In addition, another object of embodiments of the present invention is to provide a battery rack in which a cooling member in contact with a plurality of battery cells comes into direct contact with an external refrigerant (outside air), such that cooling efficiency may be improved.

Further, another object of embodiments of the present invention is to provide a battery rack in which one battery module may be provided with more than two times battery cells therein than the conventional battery rack.

Further, another object of embodiments of the present invention is to provide a battery rack in which the number of battery rack components such as module controllers installed for each battery module and module bus bars included in each battery module is decreased, such that costs and time during manufacturing may be reduced.

Further, another object of embodiments of the present invention is to provide a battery rack capable of minimizing a risk of safety accident during connecting a plurality of battery submodules in each battery module.

Further, another object of embodiments of the present invention is to provide a battery rack in which cooling fans may be provided on one side of an entire battery rack to effectively cool a plurality of battery modules.

Further, another object of embodiments of the present invention is to provide a battery rack capable of uniformly cooling a plurality of battery modules when the entire battery rack is provided with a cooling fan on one side thereof.

Further, another object of embodiments of the present invention is to provide a battery rack that may have sufficient structural durability without a separate module case for housing a plurality of battery cells.

Further, another object of embodiments of the present invention is to provide a battery rack capable of reducing the number of battery modules per battery rack from one-half to one-third of the conventional battery rack.

Furthermore, another object of embodiments of the present invention is to provide a battery rack capable of efficiently forming a high-voltage battery rack system for an energy storage system (ESS).

In order to achieve the above objects, according to one aspect of the present invention, there is provided a battery rack including: a housing; a plurality of battery modules stacked in the housing; and connection members configured to electrically connect the plurality of battery modules, wherein each of the plurality of battery modules includes a plurality of battery submodules stacked on each other, and each of the plurality of battery submodules includes: at least one cooling member; and a plurality of battery cells located on both sides with the at least one cooling member interposed therebetween, wherein at least two of the plurality of battery cells are located on each of both sides of the at least one cooling member.

The plurality of battery cells may be in surface contact with the at least one cooling member.

The cooling member may include: contact parts to which the plurality of battery cells are in contact; and exposed parts which extends from at least one end of the contact parts at a predetermined angle with respect to the contact parts.

The exposed part may be exposed to at least one surface of each of the plurality of battery modules.

The number of the one or more cooling members may correspond to the number of battery cells which are in contact with one side of the at least one cooling member of the plurality of battery cells.

Each of the plurality of battery submodules may further include a fixing frame configured to fix and support the cooling member and the plurality of battery cells.

Each of the plurality of battery submodules may include a first fixing frame configured to fix and support at least two of the cooling members.

Each of the plurality of battery submodules may include a second fixing frame configured to be coupled with the first fixing frame, so as to support the plurality of battery cells and fix positions thereof.

Each of the plurality of battery modules may include at least one fixed beam configured to fix and support the plurality of stacked battery submodules.

Each of the plurality of battery modules may further include a protective cover unit configured to protect the plurality of stacked battery submodules, and the protective cover unit may include a front cover unit and a rear cover unit, which are located on both sides among outer surfaces of the plurality of battery submodules in a direction in which the plurality of battery submodules are stacked, and side cover units located on sides from which electrode tabs of the battery submodules protrude.

Each of the plurality of battery modules may include at least one latch screw which is coupled to the front cover unit and includes a latch groove formed by cutting away at least a part of an outer peripheral surface thereof inward.

Each of the plurality of battery modules may include a grip groove formed by cutting away at least a part of the side cover unit toward the battery submodule.

Each of the plurality of battery modules may include elastic pads each of which is interposed between one or more battery submodules adjacent to each other in the plurality of battery submodules.

The battery rack may further include: a cooling fan located at an upper or a lower side of the plurality of stacked battery modules to dissipate heat generated from the plurality of battery modules.

The plurality of battery modules may be stacked at a predetermined distance, and the predetermined distance may be gradually increased from one side of the upper and lower sides, in which the cooling fan is located, toward the other side.

The cooling fan may be located at one side of the direction in which the battery submodules are stacked at the upper or lower side of the plurality of stacked battery modules, and a closed surface on a side, in which the cooling fan is located among peripheral surfaces perpendicular to the direction in which the plurality of battery modules are stacked, may be spaced apart from the plurality of battery modules at a predetermined distance.

Battery cells facing each other of the plurality of battery cells on both sides of the at least one cooling member in each of the battery submodules may be connected to each other in series or in parallel, and the plurality of battery submodules in each of the battery modules may be connected to each other in series or parallel to.

According to embodiments of the present invention, the cooling efficiency of a plurality of battery cells of each battery module provided in the housing may be increased.

In addition, according to the embodiments of the present invention, the cooling member in contact with the plurality of battery cells comes into direct contact with the external refrigerant (outside air), such that the cooling efficiency may be improved.

In addition, according to the embodiments of the present invention, one battery module may be provided with more than two times battery cells therein than the conventional battery rack.

In addition, according to the embodiments of the present invention, the number of battery rack components such as module controllers installed for each battery module and module bus bars included in each battery module is decreased, such that costs and time during manufacturing may be reduced.

Further, according to the embodiments of the present invention, it is possible to minimize the risk of safety accident during connecting the plurality of battery submodule in each battery module.

In addition, according to the embodiments of the present invention, the cooling fan may be provided on one side of an entire battery rack to effectively cool the plurality of battery modules.

In addition, according to the embodiments of the present invention, it is possible to uniformly cool the plurality of battery modules when the entire battery rack is provided with the cooling fan on one side thereof.

In addition, according to the embodiments of the present invention, the battery rack may have sufficient structural durability without a separate module case for housing a plurality of battery cells.

In addition, according to the embodiments of the present invention, it is possible to reduce the number of battery modules per battery rack from one-half to one-third of the conventional battery rack.

Further, according to the embodiments of the present invention, a high-voltage battery rack system for an energy storage system (ESS) may be efficiently formed.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
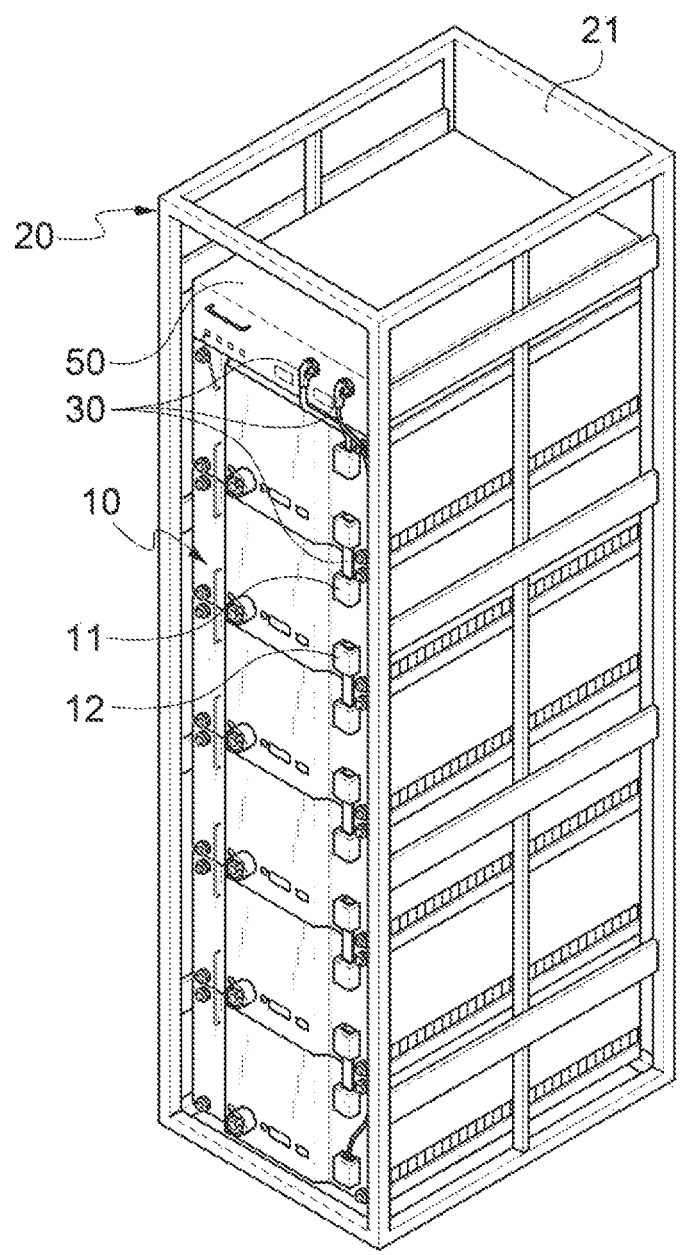
FIG. 1 is a perspective view illustrating a battery rack according to an embodiment of the present invention.

Hereinafter, specific embodiments of the present invention will be described with reference to the accompanying drawings. However, these are merely illustrative examples and the present invention is not limited thereto.

In descriptions of the embodiments of the present invention, publicly known techniques that are judged to be able to make the purport of the present invention unnecessarily obscure will not be described in detail. Referring to the drawings, wherein like reference characters designate like or corresponding parts throughout the several views. In addition, the terms as used herein are defined by taking functions of the present disclosure into account and can be changed according to the custom or intention of users or operators. Therefore, definition of the terms should be made according to the overall disclosure set forth herein.

It should be understood that the technical spirit and scope of the present invention are defined by the appended claims, and the following embodiments are only made to efficiently describe the present invention to persons having common knowledge in the technical field to which the present invention pertains.

FIG. 1 is a perspective view illustrating a battery rack 1 according to an embodiment of the present invention.

Referring to FIG. 1, the battery rack 1 according to the embodiment of the present invention may include a housing 20, a plurality of battery modules 10 stacked in the housing 20, and connection members 30 configured to electrically connect the plurality of battery modules 10.

At this time, at least a part among peripheral surfaces of the housing 20 perpendicular to a direction in which the plurality of battery modules 10 are stacked may be sealed, and the remaining parts of the peripheral surfaces may be opened. In particular, a side face on which a front surface of the battery module 10 is located may be opened, such that an operator may easily install the plurality of battery modules 10 in the housing 20 during installing the battery rack 1.

Meanwhile, a closed surface 21, which is sealed among the peripheral surfaces of the housing 20, will be described in detail below.

Further, the plurality of battery modules 10 may be electrically connected to each other by the connection member 30, and preferably, forms the battery rack 1 according to the embodiment of the present invention with being connected in series to each other.

Meanwhile, the battery rack 1 according to the embodiment of the present invention may further include a battery rack controller 50 configured to control the plurality of battery modules 10.

At this time, the plurality of battery modules 10 may be connected to the battery rack controller 50 through the connection members 30. When short-circuit occurs in any one of the plurality of battery modules 10, the battery rack controller 50 may prevent a safety accident such as a fire or an explosion by disconnecting the electrical connection of a high voltage.

Figure 2:
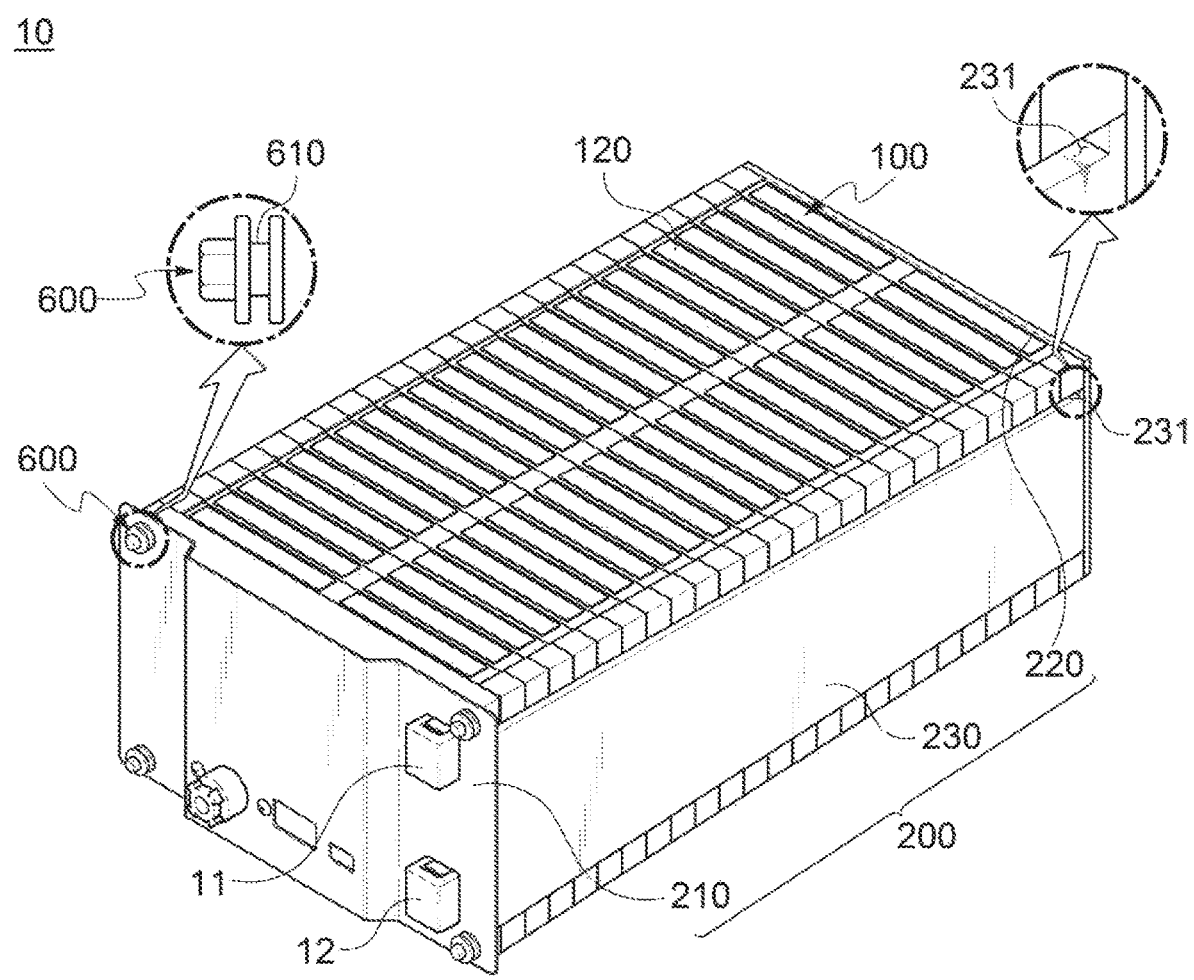
FIG. 2 is a perspective view illustrating a battery module of the battery rack according to the embodiment of the present invention.

FIG. 2 is a perspective view illustrating the battery module 10 of the battery rack 1 according to the embodiment of the present invention.

Referring to FIG. 2, each of the plurality of battery modules 10 included in the battery rack 1 according to the embodiment of the present invention may include a plurality of battery submodules 100 stacked on each other.

Specifically, the battery module 10 may include a plurality of battery submodules 100 stacked to face each other, and a protective cover unit 200 for protecting the plurality of stacked battery submodules 100.

Meanwhile, the protective cover unit 200 may include a front cover unit 210 and a rear cover unit 220, which are located on both sides among outer surfaces of the plurality of battery submodules 100 in a direction in which the plurality of battery submodules 100 are stacked. At this time, the plurality of battery submodules 100, the front cover unit 210 and the rear cover unit 220 may be located parallel to each other.

In addition, among the outer surfaces of the plurality of battery submodules 100 stacked in the battery module 10, other side faces except for the front cover unit 210 and the rear cover unit 220 sides may be opened to be exposed to an outside. However, it is not limited thereto, and a side face of the battery module 10, from which electrode tabs 112 of the battery cell 110 protrude, may be protected from external foreign matters by side cover units 230.

In this regard, upper and lower surfaces of the battery module 10 except for the front surface, rear surface and side faces thereof may be exposed to the outside, and at least a part of a cooling member 120 (illustrated in FIG. 3) to be described below may be exposed to the outside of the battery module 10, thus to effectively dissipate heat generated from the plurality of battery cells.

In addition, the battery module 10 may include a first terminal 11 and a second terminal 12 formed on the front surface thereof, which are connected to the connection members 30 so as to electrically connect the plurality of battery modules 10. At this time, the first terminal 11 and the second terminal 12 are formed together on one edge portion of the front surface of the battery module 10, such that the operator may easily install and manage the battery rack 1 according to the embodiment of the present invention.

Meanwhile, each of the battery modules 10 may include a grip groove 231 formed by cutting away at least a part of the side cover unit 230 toward the plurality of battery submodules 100 in the direction in which the plurality of battery submodules 100 are stacked.

Specifically, the battery module 10 of the battery rack 1 according to the embodiment of the present invention may be formed by stacking the plurality of battery submodules 100. At this time, a predetermined space may be formed by cutting away a part of the side cover unit 230 inward the battery module 10 between an upper edge portion of a fixing frame 130 of the plurality of stacked battery submodules 100 and the side cover unit 230. That is, the grip groove 231 may be formed at an upper end of the side cover unit 230 in the direction in which the battery submodule 100 is stacked.

Thereby, a user or the operator may easily lift the battery module 10 by gripping the grip grooves 231, and therefore operation efficiency during transporting and installing the battery module 10 may be improved.

In addition, the battery module 10 of the battery rack 1 according to the embodiment of the present invention may further include at least one latch screw 600 which may be screwed to the front cover unit 210. At this time, the latch screw 600 may include a latch groove 610 formed by cutting away at least a part of an outer peripheral surface thereof inward. Thereby, the user or operator may move the battery module 10 by hooking a latch member (not illustrated) such as a handle formed in a hook shape to the latch groove 610.

That is, the user or operator may easily move the battery module 10 in a horizontal direction by hooking the latch member such as a handle to the latch groove 610 of the latch screw 600 coupled to the front surface of the battery module 10, and then pushing or pulling the battery module 10. Thereby, the battery module 10 may be easily installed and moved during installing it in the battery rack 1 according to the embodiment of the present invention.

Figure 3:
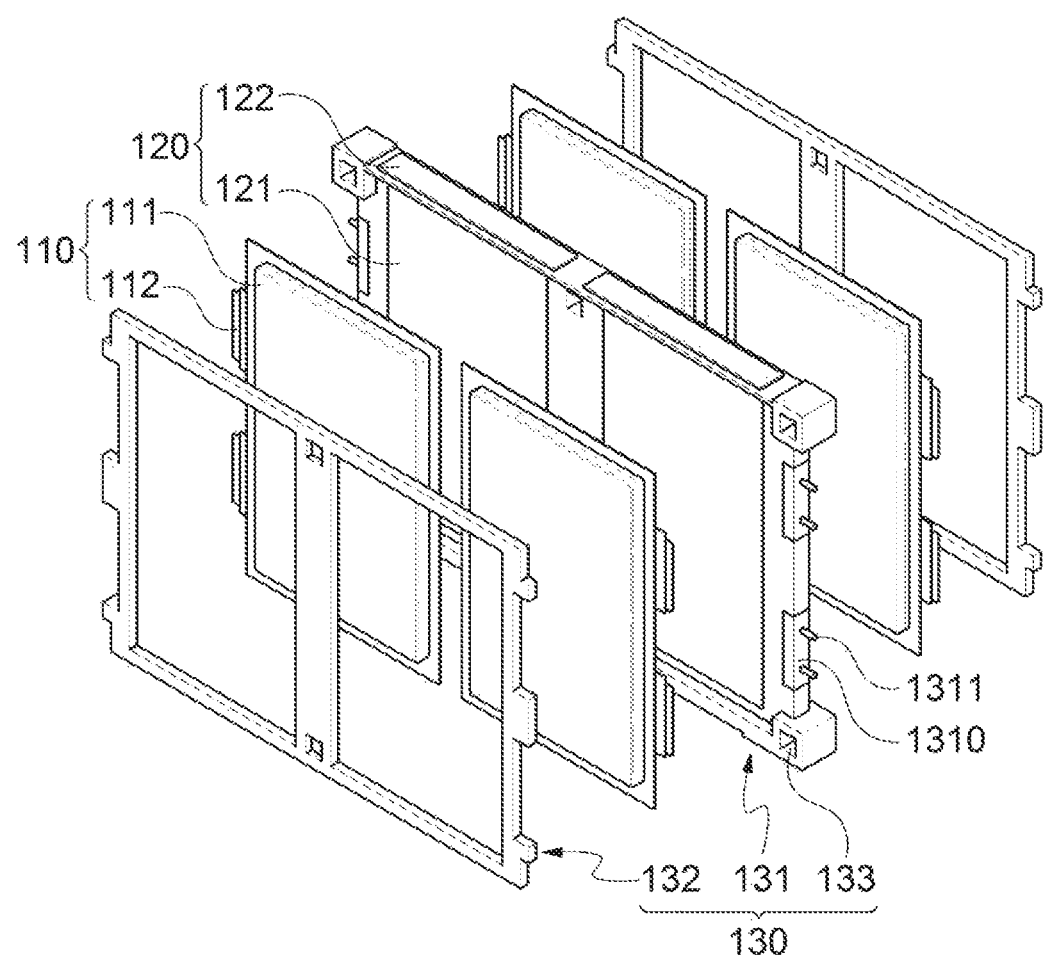
FIG. 3 is an exploded perspective view of a battery submodule included in a battery module of the battery rack according to the embodiment of the present invention.
Figure 4:
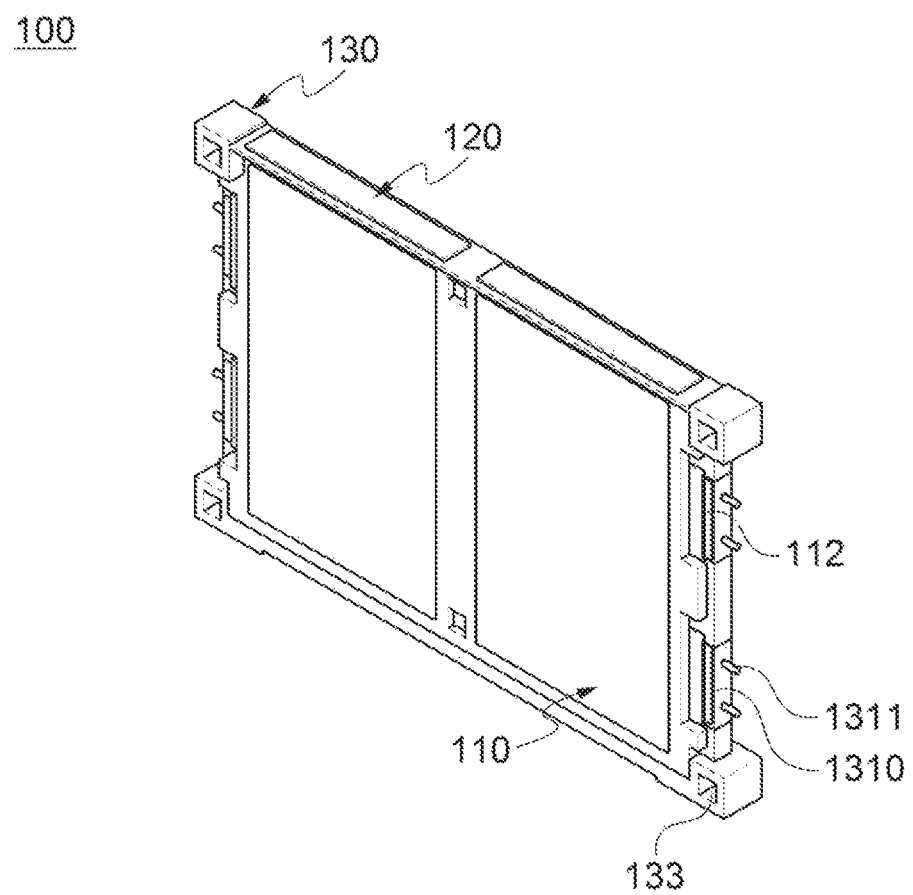
FIG. 4 is a perspective view illustrating the battery submodule included in the battery module of the battery rack according to the embodiment of the present invention.

FIG. 3 is an exploded perspective view of the battery submodule 100 included in the battery module 10 of the battery rack 1 according to the embodiment of the present invention, and FIG. 4 is a perspective view illustrating the battery submodule 100 included in the battery module 10 of the battery rack 1 according to the embodiment of the present invention.

Referring to FIGS. 3 and 4, each of the plurality of battery submodules 100 may include at least one cooling member 120, and the plurality of battery cells 110 located on both sides with at least one cooling member 120 interposed therebetween.

In this case, each of the plurality of battery cells 110 included in the battery rack 1 according to the embodiment of the present invention may include a cell body 111, and electrode tabs 112 protruding from one side of the cell body 111. Meanwhile, in the battery submodule 100 of the battery rack 1 according to the embodiment of the present invention, two electrode tabs 112 will be described based on an unidirectional polarity battery cell 110 protruding from one side of the cell body 111, while a battery rack according to another embodiment of the present invention, which includes bidirectional polarity battery cell 110', will be described below.

In addition, at least two of the plurality of battery cells 110 may be located on each of both sides of at least one cooling member 120 arranged side by side. That is, each of the plurality of battery submodules 100 may include at least four battery cells 110.

At this time, each of the plurality of battery submodules 100 may include at least two cooling members 120, and each of two or more battery cells 110 on one of both sides of the battery submodule 100 may be located corresponding to each of two or more cooling members 120.

Further, the plurality of battery cells 110 may come into surface contact with at least one cooling member 120. Specifically, each of the one or more cooling members 120 may include contact parts 121 which are formed in a plate shape to come into surface contact with at least one battery cell 110, and exposed parts 122 which extend from at least one end of the contact parts 121 at a predetermined angle with respect to the contact parts 121. More specifically, the exposed parts 122 may extend from at least one end of the contact parts 121 perpendicularly to the contact part 121. Thereby, the exposed parts 122 of the cooling member 120 form upper and lower surfaces of the battery submodule 100 to be exposed to the outside, and the exposed parts 122 exposed to the outside may come into contact with an outside air to be subject to convective heat transfer. Referring to FIG. 2, it can be confirmed a configuration in which the exposed parts 122 of the cooling members 120 in the battery module 10 are exposed to the outside.

Further, the cooling member 120 may be made of a material having a high thermal conductivity such as aluminum Al to cool the plurality of battery cells 110 in contact with the cooling member 120. The plurality of battery cells 110 may be effectively cooled through the exposed parts 122 which are exposed to the outside by coming into direct contact with the contact parts 121 of the highly thermal-conductive cooling member 120 in a large area. A cooling method of the battery cell 110 will be described in detail below.

Meanwhile, the number of the one or more cooling members 120 may be determined corresponding to the number of battery cells 110 which are in contact with one side of at least one cooling member 120 of the plurality of battery cells 110.

That is, when two battery cells 110 are located at one side of one battery submodule 100 to come into contact with at least one cooling member 120, each of the plurality of battery submodules 100 may include two cooling members 120, and each of the two battery cells 110 may come into surface contact with the contact parts 121 of each of the two cooling members 120.

In addition, the two cooling members 120 in one battery submodule 100 may be arranged side by side on the same plane. Specifically, the two cooling members 120 may be arranged side by side so that the contact parts 121 thereof are located on the same plane, thereby two battery cells 110 on one side of the two cooling members 120 may also be located side by side. Referring to FIG. 2, the cooling members 120 are arranged side by side on both sides in the direction in which the plurality of battery submodules 100 are stacked.

Thereby, each one battery cell 110 comes into contact with both sides of one cooling member 120, such that the possibility of electrical communication between at least two battery cells 110 through the cooling member 120 on one side of one battery submodule 100 may be blocked.

However, the number of the battery cells 110 included in the battery submodule 100 is not limited thereto, and two or more overlapped-battery cells 110 may be located on both sides of one cooling member 120. In this case, one battery submodule 100 may include eight battery cells 110.

Each of the plurality of battery submodules 100 may further include at least one cooling member 120 and the fixing frame 130 for fixing and supporting the plurality of battery cells 110.

In this case, the fixing frame 130 may include a first fixing frame 131 for fixing and supporting at least one cooling member 120 so as to be located in parallel to each other, and a second fixing frame 132 which may be located at the outermost side of the battery submodule 100 to be coupled to the first fixing frame 131, and may fix and support the plurality of battery cells 110 in contact with the at least one cooling member 120 as it is coupled with the first fixing frame 131.

In addition, the second fixing frame 132 may have openings formed at portions in which the plurality of battery cells 110 are located, such that one side of cell bodies 111 of the plurality of battery cells 110, which is not in contact with the cooling member 120, may be exposed to the outside through the openings.

Specifically, the first fixing frame 131 may fix and support at least two cooling members 120 so that they are located in parallel to each other. At this time, the first fixing frame 131 and the second fixing frame 132 may be made of an insulation material, such that the possibility of electrical communication between the at least two cooling members 120 located in the first fixing frame 131 may be blocked. Thereby, a problem, in which at least two battery cells 110 (i.e., the battery cells 110 on the left and right sides in the drawing) in contact with each of the at least two cooling members 120 are electrically connected with each other through the cooling member 120, may be blocked.

In addition, the first fixing frame 131 may further include one or more terminal parts 1310 which are formed at positions in contact with the electrode tabs 112 of the plurality of battery cells 110, and respectively include at least one fastening pin 1311.

Specifically, the at least one terminal part 1310 may be formed in the number corresponding to the number of electrode tabs 112 of at least two battery cells 110 located on one side of one battery submodule 100. Herein, both sides of each terminal part 120 may be electrically connected with the electrode tabs 112 of the battery cells 110 which are located on both sides of the cooling member 120 to face each other through a first bus bar 510 or the like, which will be described below. At this time, the electrode tabs 112 of the battery cells 110 facing each other on both sides of the cooling member 120 may be formed with electrodes having the same polarity as each other and connected in parallel to each other.

The fixing frame 130, to which the first fixing frame 131 and the second fixing frame 132 are coupled, may include at least one beam insertion hole 133 which is formed at a position corresponding to at least one fixed beam 300 to be described below, into which the fixed beam 300 is inserted.

As described above, in the battery submodule 100 of the battery rack 1 according to the embodiment of the present invention, double, triple or more battery cells 110 may be located on the same plane. Therefore, the number of the battery cells 110 provided per battery module 10 may be significantly increased compared to the conventional battery rack, and the number of battery modules 10 per battery rack 1 may be reduced from one-half to one-third of the conventional battery rack. Therefore, the energy density of the entire battery rack 1 may be greatly improved.

Figure 5:
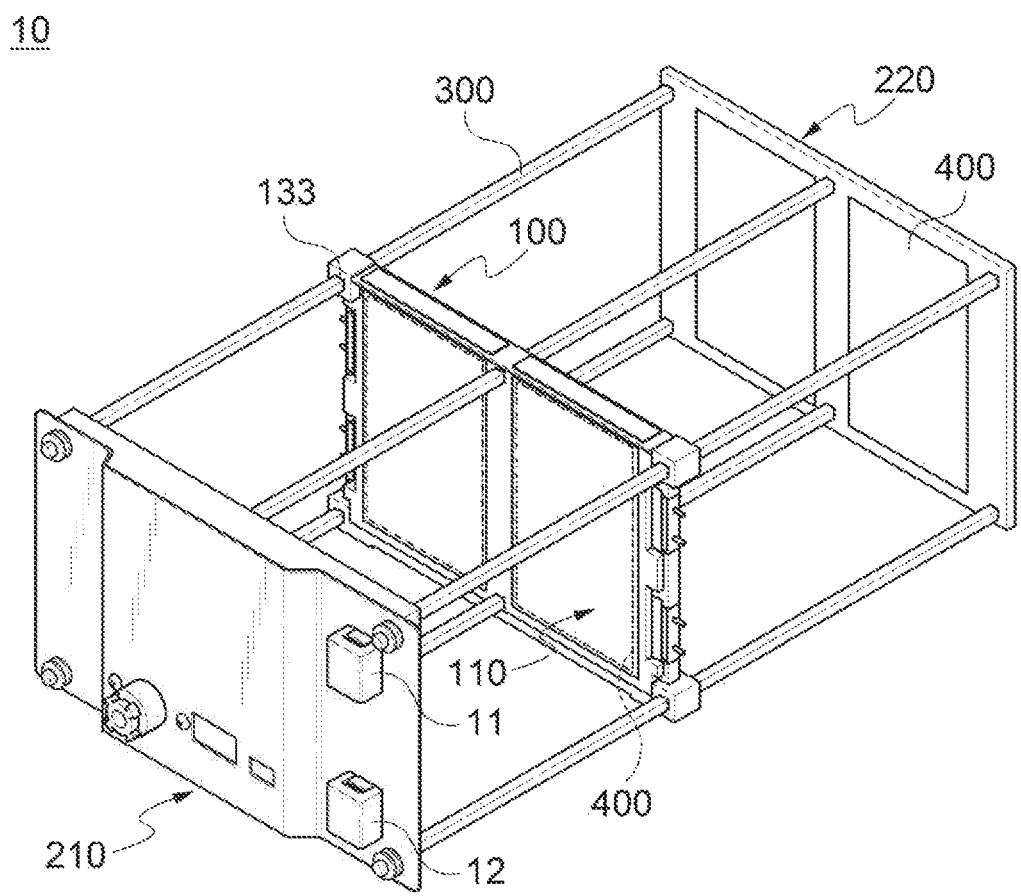
FIG. 5 is a perspective view illustrating a state in which the battery submodule and a fixed beam are coupled in the battery module of the battery rack according to the embodiment of the present invention.

FIG. 5 is a perspective view illustrating a state in which the battery submodule 100 and the fixed beam 300 are coupled in the battery module 10 of the battery rack 1 according to the embodiment of the present invention. At this time, for the convenience of description, only one battery submodule 100 is coupled to the fixed beam 300 as illustrated in FIG. 5, but the plurality of battery submodules 100 may be coupled to the fixed beam 300 in the same method with being stacked.

Referring to FIG. 5, each of the plurality of battery modules 10 included in the battery rack 1 according to the embodiment of the present invention may include at least one fixed beam 300 for fixing and supporting the plurality of stacked battery submodules 100. At this time, the at least one fixed beam 300 may be inserted into at least one beam insertion hole 133 formed in the fixing frame 130 of the battery submodule 100 to fix and support the battery submodule 100. Meanwhile, the fixed beam 300 may be formed in a stick shape and may extend in the direction in which the plurality of battery submodules 100 are stacked. At this time, the fixed beam 300 has a cross-section formed with at least one corner such as a rectangular, so that the plurality of battery submodules 100 may be reliably fixed and supported.

As described above, the plurality of stacked battery submodules 100 may be fixed to at least one fixed beam 300 to be maintained with being stacked, and may ensure the structural rigidity without a separate case or the like surrounding the outer surface thereof. Accordingly, the entire weight of the battery module 10 is decreased, such that the battery module 10 may be easily transported and installed, as well as costs and time during manufacturing thereof may be reduced.

Meanwhile, FIG. 5 illustrates a case in which six fixed beams 300 are inserted into the beam insertion hole 133 of the battery submodule 100, but it is not limited thereto, and any number of the fixed beams 300 may be used so long as they can sufficiently maintain the structural rigidity between the plurality of battery submodules 100.

In addition, at least one fixed beam 300 may be fixedly coupled to the front cover unit 210 and the rear cover unit 220. Each of the plurality of battery modules 10 may include elastic pads 400 each of which is interposed between one or more battery submodules 100 adjacent to each other in the plurality of battery submodules 100.

Thereby, the elastic member may mitigate an expansion of the plurality of battery cells 110 in the battery submodule 100 due to swelling, and may prevent external impact and vibration from being transmitted to the battery cells 110. Also, since the plurality of battery submodules 100 are fixed in a state in which the front cover unit 210 and the rear cover unit 220 are located on both sides in the stacking direction, it is possible to inhibit the plurality of battery cells 110 from being expanded in the direction in which the plurality of battery submodules 100 are stacked.

Meanwhile, it is not limited the configuration in which the elastic members disposed between every battery submodules 100, and the battery submodules 100 may be disposed between two bundles or three bundles thereof by selecting the number of bundles, as necessary.

In addition, the at least one fixed beam 300 may be firmly coupled to the front cover unit 210 and the rear cover unit 220 by bolt and nut fastening, rivet fastening, and the like, but it is merely an example, and it is not limited to a specific fastening method.

Figure 6:
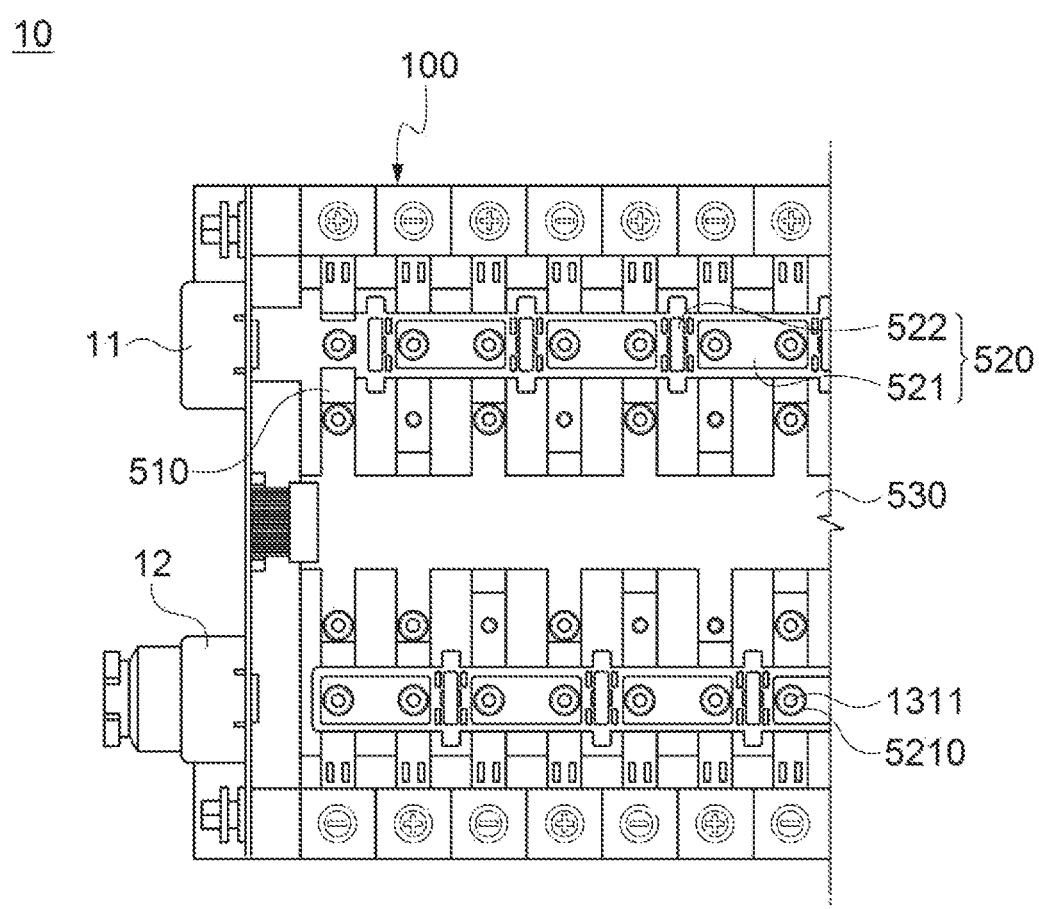
FIG. 6 is a plan view illustrating an electrical connection structure between a plurality of battery submodules in the battery module of the battery rack according to the embodiment of the present invention.
Figure 7:
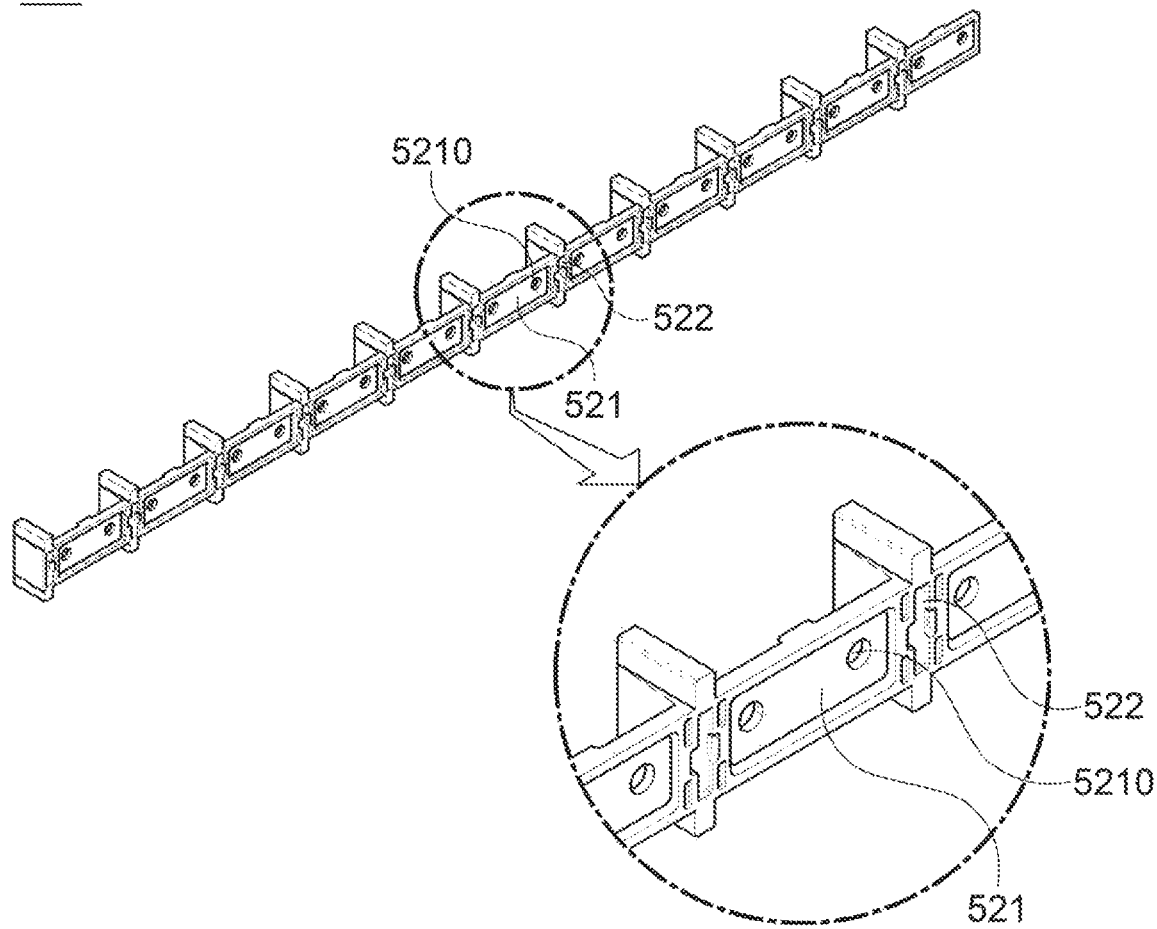
FIG. 7 is a perspective view illustrating a bus bar assembly included in the battery module of the battery rack according to the embodiment of the present invention.

FIG. 6 is a plan view illustrating an electrical connection structure between the plurality of battery submodules 100 in the battery module 10 of the battery rack 1 according to the embodiment of the present invention, and FIG. 7 is a perspective view illustrating a bus bar assembly 520 included in the battery module 10 of the battery rack 1 according to the embodiment of the present invention.

Referring to FIGS. 6 and 7, first, as described above, the battery cells 110, which are located in one battery submodule 100 and are in contact with the same cooling member 120 to face each other, may be connected to each other in parallel through the first bus bar 510. At this time, the first bus bar 510 is formed in a 'U' shape, and may be electrically connected to the electrode tabs 112 of the battery cell 110 facing each other by laser welding or the like. In this case, the first bus bar 510 may be electrically connected to the electrode tabs 112 with being fastened to the fastening pins 1311 of the terminal part 1310, thereby facilitating the electrical connection operation.

However, the electrical connection method at this time is not limited to laser welding, and ultrasonic welding, soldering, or the like may be used. In addition, it will be obviously appreciated to those skilled in the art that the electrical connection may be performed by using an adhesive such as a bond of a physical fastening method such as screwing.

In addition, the first bus bars 510 may be connected to each other in series by a second bus bar 521. At this time, as illustrated in FIG. 7, the second bus bar 521 may be coupled integrally with the bus bar frame 522 to form the bus bar assembly 520. Since the bus bar frame 522 is made of an insulation material such as plastic, the possibility that the second bus bar 521 is short-circuited may be blocked.

Thereby, the operator may simply fasten and couple one bus bar assembly 520 to the fastening pins 1311 formed in the plurality of bus bar submodules 100, without having to attach the second bus bars 521 one by one for serial connection between the plurality of first bus bars 510. Therefore, it is possible to minimize risks of short-circuit and safety accidents that may occur during connecting the plurality of submodules 100 in series. However, it will be obviously appreciated to those skilled in the art that the electrical connection between the plurality of first bus bars 510 are not limited to serial connection, but may be connected in parallel.

Further, each of the plurality of battery modules 10 included in the battery rack 1 according to the embodiment of the present invention may further include a circuit unit 530 which is connected to the plurality of first bus bars 510 to measure a voltage value to determine a voltage state in the plurality of battery submodules 100. At this time, the bus bar assembly 520 and the circuit unit 530 may be fastened to the fastening pin 1311 formed in the terminal part 1310.

Specifically, each of the second bus bars 521 of the bus bar assembly 520 may include two fastening holes 5210 formed therein, and the fastening pins 1311 of the terminal part 1310 may be inserted into the fastening holes 5210 of the second bus bar 521. As illustrated in FIG. 6, the bus bar assembly 520 may be located at upper and lower portions of the battery module 10 to be fastened to the uppermost and lowermost fastening pins 1311, and the circuit unit 530 may be located between the upper and lower bus bar assemblies 520 to be fastened to the upper and lower fastening pins 1311.

Figure 8:
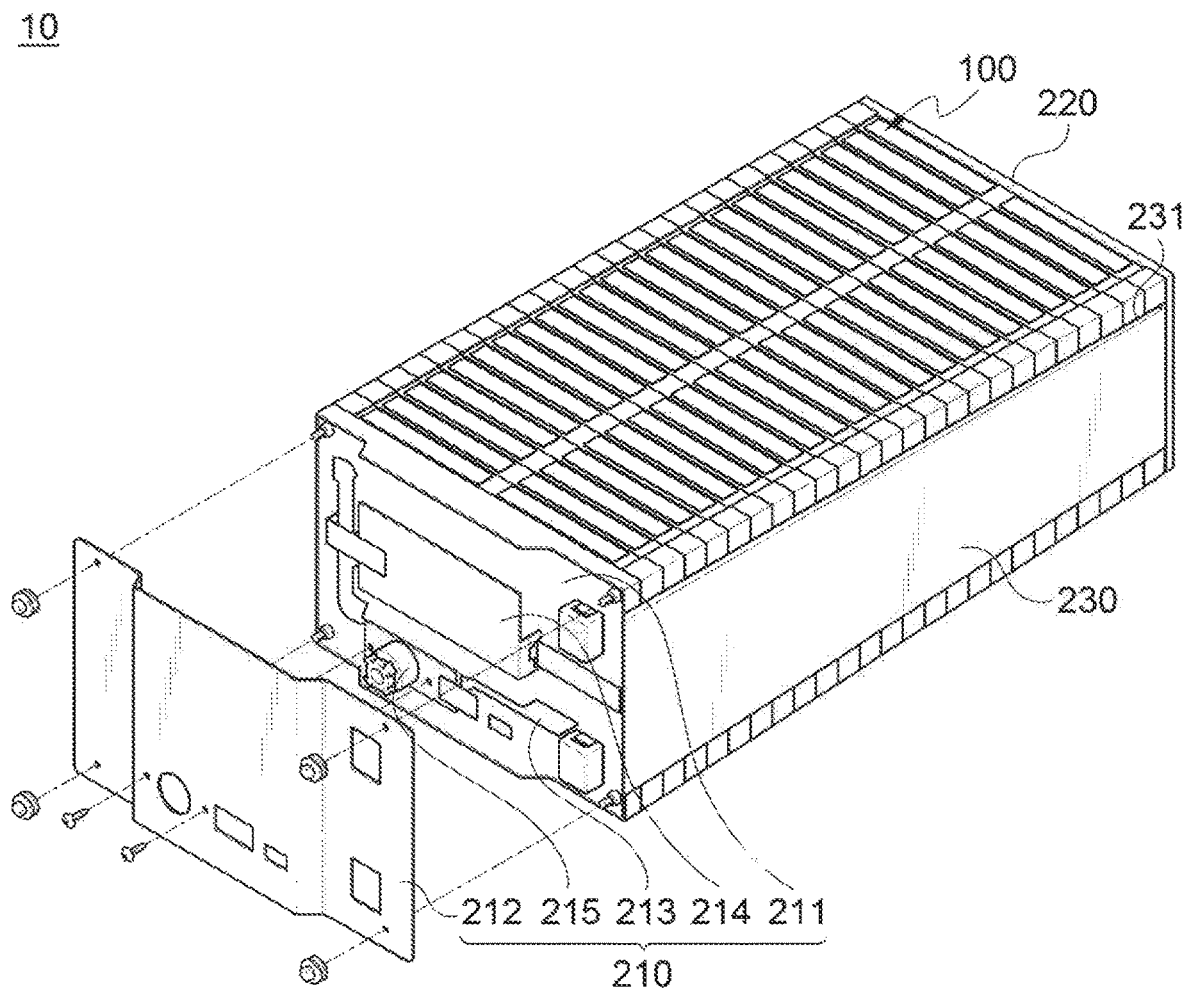
FIG. 8 is a perspective view illustrating a state in which a front cover unit is disassembled from the battery module of the battery rack according to the embodiment of the present invention.
Figure 9:
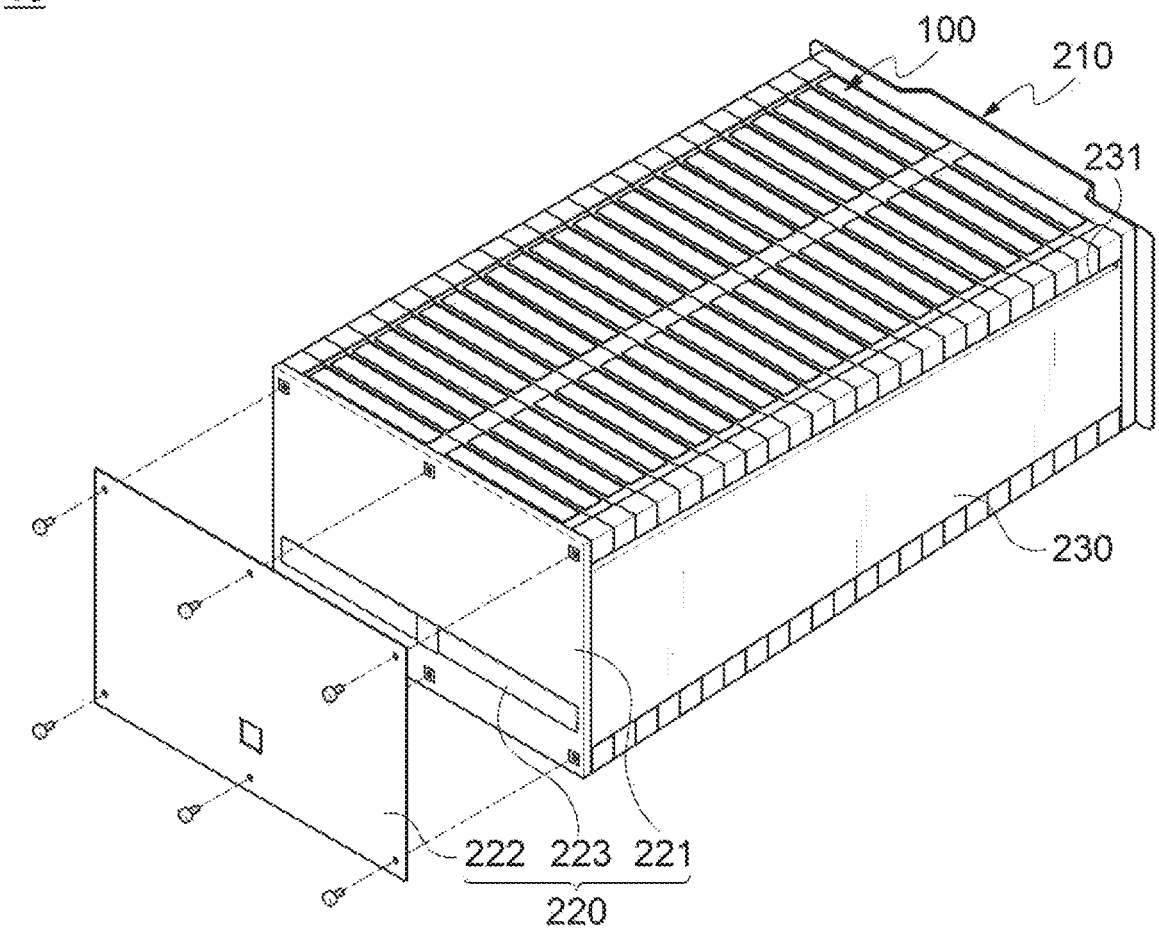
FIG. 9 is a perspective view illustrating a state in which a rear cover unit is disassembled from the battery module of the battery rack according to the embodiment of the present invention.

FIG. 8 is a perspective view illustrating a state in which the front cover unit 210 is disassembled from the battery module 10 of the battery rack 1 according to the embodiment of the present invention, and FIG. 9 is a perspective view illustrating a state in which the rear cover unit 220 is disassembled from the battery module 10 of the battery rack 1 according to the embodiment of the present invention.

Referring to FIGS. 8 and 9, first, as described above, the plurality of battery cells 110 located on each of both sides in the direction in which the plurality of battery submodules 100 are stacked may be connected in series to each other, and the serially-connected plurality of battery cells 110 may be connected in series through the module bus bar 223.

Specifically, the rear cover unit 220 may include a rear plate 221 which is located on the battery submodule 100 side to support the stacked battery submodule 100, the module bus bar 223, and a rear cover member 222 which is located outside the module bus bar 223 to protect the module bus bar 223 from the external foreign matters and block the possibility of electrical communication.

Thereby, the plurality of battery submodules 100 on both sides in the stacking direction may be connected to each other in series, respectively, and then again connected in series with each other through the module bus bar 223.

Meanwhile, the front cover unit 210 may include a front plate 211 which is located on the battery submodule 100 side to support the stacked battery submodule 100, a battery management system (BMS) module 214 for controlling the battery module 10, a high voltage connection member 213 for electrically connecting the first bus bar 510 on the front surface of the battery module 10 on one side of both sides in the direction in which the plurality of battery submodules 100 are stacked and the second terminal 12, and a front cover member 212 which is located outside the BMS module 214 and the high voltage connection member 213 to protect the same from the external foreign matters.

At this time, in the battery rack 1 according to the embodiment of the present invention, the respective BMS modules 214 installed in each of the plurality of battery modules 10 may be connected to each other, and then connected to the battery rack controller 50. Thereby, the battery rack controller 50 may control the entire battery module 10 through the BMS modules 214 installed in the plurality of battery modules 10.

In addition, a manual service device (MSD) module 215, which may select whether to apply voltage to the battery module 10 as it is manually opened or closed, may be attached to the high voltage connection member 213.

As described above, the first terminal 11 and the second terminal 12 of the battery module 10 are located together on one side through the high voltage connection member 213 and the like. Therefore, operations for installing the battery rack 1 according to the embodiment of the present invention and connecting the plurality of battery modules 10 may be facilitated, and when installing and transporting the battery module 10, it is possible to prevent a safety accident due to the first terminal 11 and the second terminal 12 with a high voltage, through the MSD module 215 installed in the high voltage connection member 213.

Meanwhile, the rear plate 221 and the rear cover member 222, as well as the front plate 211 and the front cover member 212 may be screwed together by bolts or the like, but it is not limited thereto.

Figure 10:
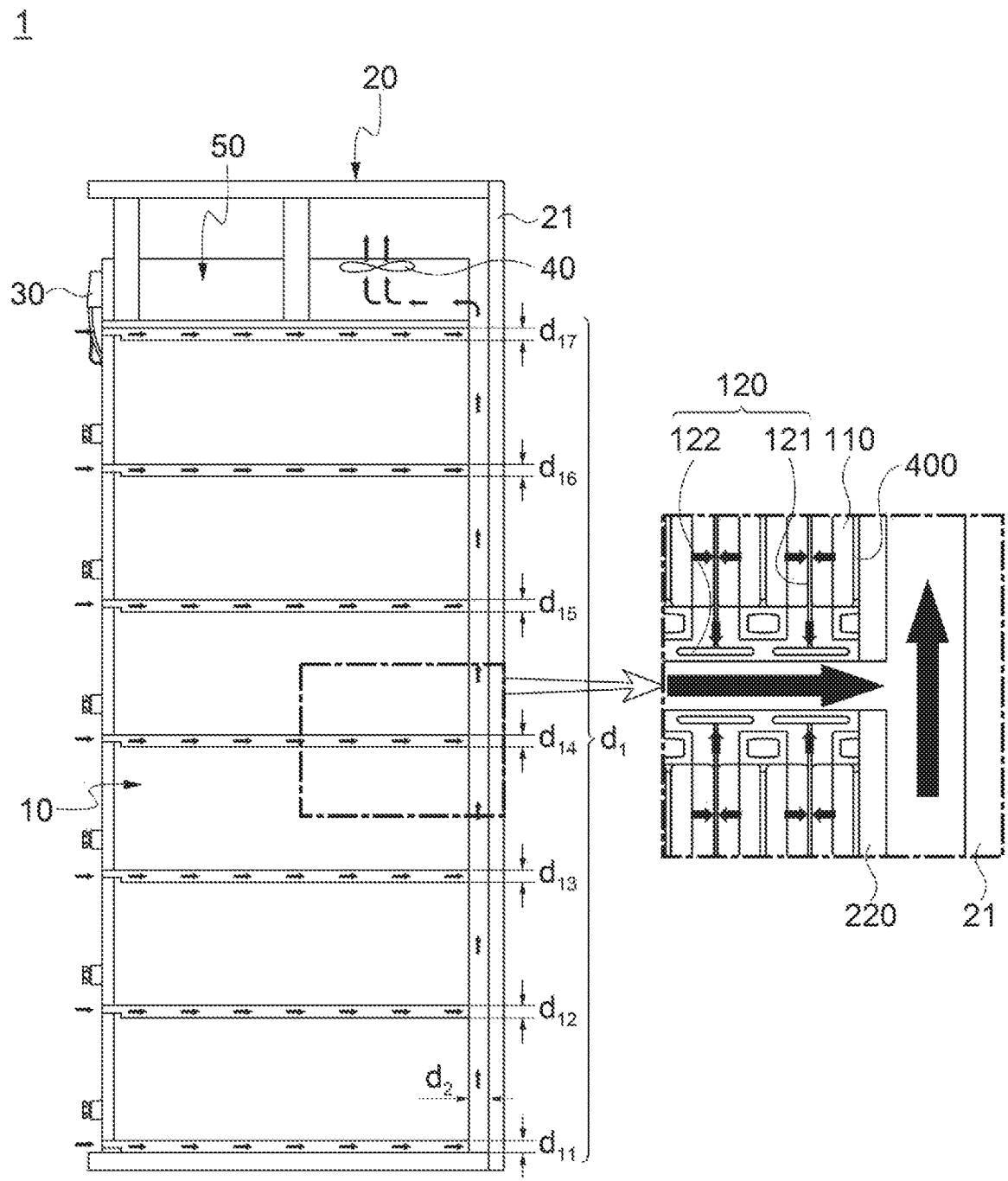
FIG. 10 is a side view schematically illustrating a state of dissipating heat in a plurality of battery modules disposed in the battery rack according to the embodiment of the present invention are dissipated.
Figure 11:
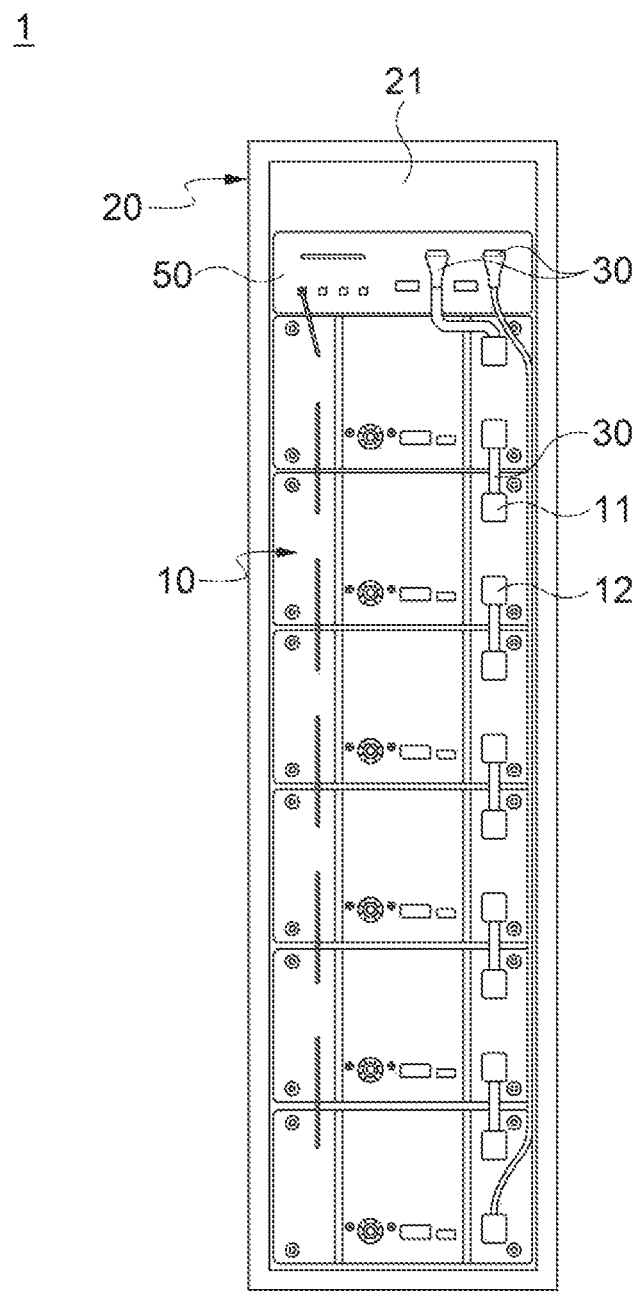
FIG. 11 is a front view illustrating the battery rack according to the embodiment of the present invention.

FIG. 10 is a side view schematically illustrating a state in which the plurality of battery modules 10 disposed in the battery rack 1 according to the embodiment of the present invention are cooled, and FIG. 11 is a front view illustrating the battery rack 1 according to the embodiment of the present invention.

Referring to FIGS. 10 and 11, the battery rack 1 according to the embodiment of the present invention may further include a cooling fan 40 located at upper or lower side of the plurality of stacked battery modules 10 to dissipate heat generated from the plurality of battery modules 10.

Specifically, as illustrated in FIG. 10, the cooling fan 40 may be located at the uppermost end of the plurality of stacked battery modules 10 to cool the plurality of battery modules 10 inside the housing 20 through intake or exhaust of outside air. At this time, the exposed parts 122 of the cooling member 120 are exposed at the upper and lower surfaces of each of the plurality of battery modules 10, such that cooling efficiency of the battery module 10 may be increased.

That is, each of the plurality of battery cells 110 may be directly cooled by the surface-contacted cooling member 120 therewith, and in this case, the cooling member 120 may be cooled by the outside air introduced into a space (gap) between battery modules 10 adjacent to each other by the cooling fan 40, thus to be doubly cooled. Therefore, the plurality of battery cells 110 may be effectively cooled. In particular, during cooling, the cooling member 120, which is exposed to the upper and lower surfaces of each of the battery modules 10, may be subjected to convective heat transfer by coming into direct contact with coolant such as outside air introduced from the outside. As described above, since the cooling member 120 is exposed to the upper and lower surfaces of the battery module 10, cooling by the outside air may be performed across a wide area.

Meanwhile, the cooling fan 40 may be located at the upper or lower side of the plurality of stacked battery modules 10 with being mounted on the battery rack controller 50. Further, two or more of the cooling fans 40 may be disposed together on the upper or lower side of the plurality of battery modules 10.

In addition, the plurality of battery modules 10 may be stacked with a predetermined distance $d_1$ therebetween. At this time, the predetermined distance $d_1$ may be gradually increased from one side on which the cooling fan 40 is located toward the other side in the direction in which the battery modules 10 are stacked.

Specifically, the cooling fan 40 provided in the battery rack 1 according to the embodiment of the present invention is located only on one side of the upper and lower sides of the plurality of battery modules 10, such that flow rates of the outside air flowing each of the battery modules 10 may vary depending on the position of the cooling fan 40. However, as described above, since the distance $d_1$ between the plurality of battery modules 10 is gradually increased from one side on which the cooling fan 40 is installed toward the other side (i.e. $d_{11}>d_{12}>d_{13}>d_{14}>d_{15}>d_{16}>d_{17}$), the flow rate of the outside air flowing between the adjacent battery modules 10 may be evenly maintained, and the plurality of battery modules 10 may be uniformly cooled.

At this time, the distance $d_1$ between the battery modules 10 is formed in a range of 2 mm to 30 mm, such that the plurality of battery modules 10 may be effectively cooled.

Meanwhile, the cooling fan 40 may be located on one side or both sides of a direction in which the battery submodules 100 are stacked at the upper or lower side of the plurality of stacked battery modules 10. Further, when the cooling fan 40 is located on one side (i.e., in front of or rear of the battery rack 1) in the direction in which the plurality of battery submodules 100 are stacked at the upper or lower side of the stacked battery modules 10, the closed surface 21 on the side in which the cooling fan 40 is located among the peripheral surfaces of the housing 20 perpendicular to the direction in which the plurality of battery modules 10 are stacked may be spaced apart from the plurality of battery modules 10 with a predetermined distance $d_2$.

That is, as illustrated in FIG. 10, the cooling fan 40 may be located on a back side of the battery module 10 at the upper side of the plurality of battery modules 10 together with the battery rack controller 50, and the closed surface 21 on the back side of the battery module 10, in which the cooling fan 40 is located among the peripheral surfaces (peripheral surfaces perpendicular to a paper surface in the drawings) perpendicular to the direction in which the plurality of battery modules 10 are stacked in the housing 20, may be disposed apart from the plurality of stacked battery module 10 with the predetermined distance $d_2$.

At this time, the closed surface 21 of the housing 20 is formed in a flat plate shape that is not opened, such that it is possible to prevent the outside air flowing into the space between the battery modules 10 on the front surface of the battery rack 1 from escaping to the outside, and define a flow path so that the inflowing outer air flows to the cooling fan 40 side. Meanwhile, the predetermined distance $d_2$ of the closed surface 21 may be formed in a range of 10 mm to 100 mm, preferably 40 mm, to maximize the cooling efficiency of the plurality of battery modules 10.

Meanwhile, directions of arrows illustrated in the schematic view of FIG. 10 indicate directions in which the outside air flow, when sucking air inside the battery rack 1 according to the embodiment of the present invention and exhausting it to the outside by the cooling fan 40. On the other hand, when sucking air outside the battery rack 1 according to the embodiment of the present invention and flowing inside by the cooling fan 40, the moving direction of the air may be reversely formed.

In addition, referring to an enlarged view of FIG. 10, it may be seen that heat generated from the battery cell 110 is dissipated to the exposed parts 122 through the contact parts 121 of the cooling member 120.

As described above, the battery rack 1 according to the embodiment of the present invention is located only on one side in the direction in which the plurality of battery modules 10 are stacked, such that the entire plurality of battery modules 10 may be efficiently cooled. Therefore, it is possible to easily control the cooling fan 40, and significantly reduce installation and maintenance costs compared to a case in which the cooling fan 40 is installed for each of the conventional battery modules 10.

Figure 12:
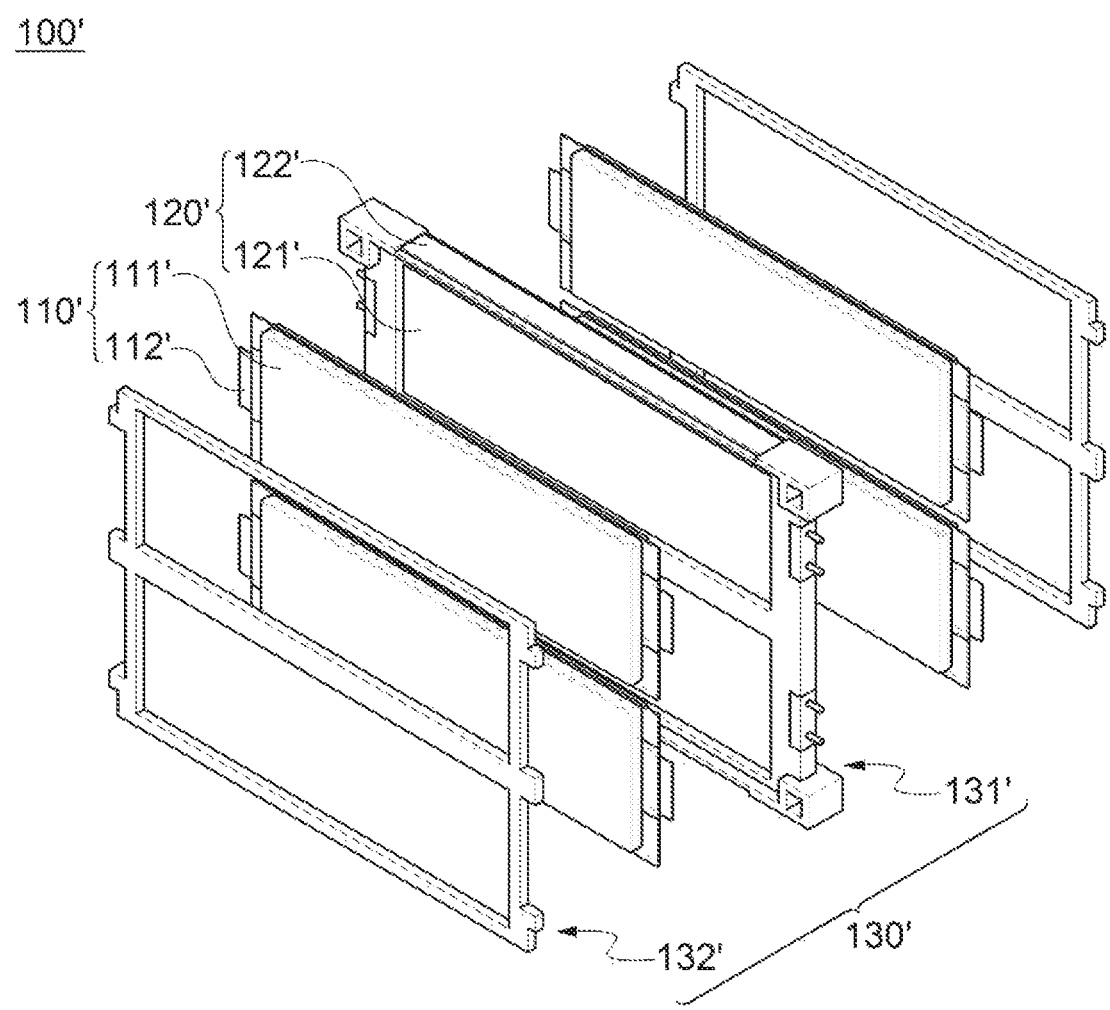
FIG. 12 is an exploded perspective view of a battery submodule included in a battery module of a battery rack according to another embodiment of the present invention.
Figure 13:
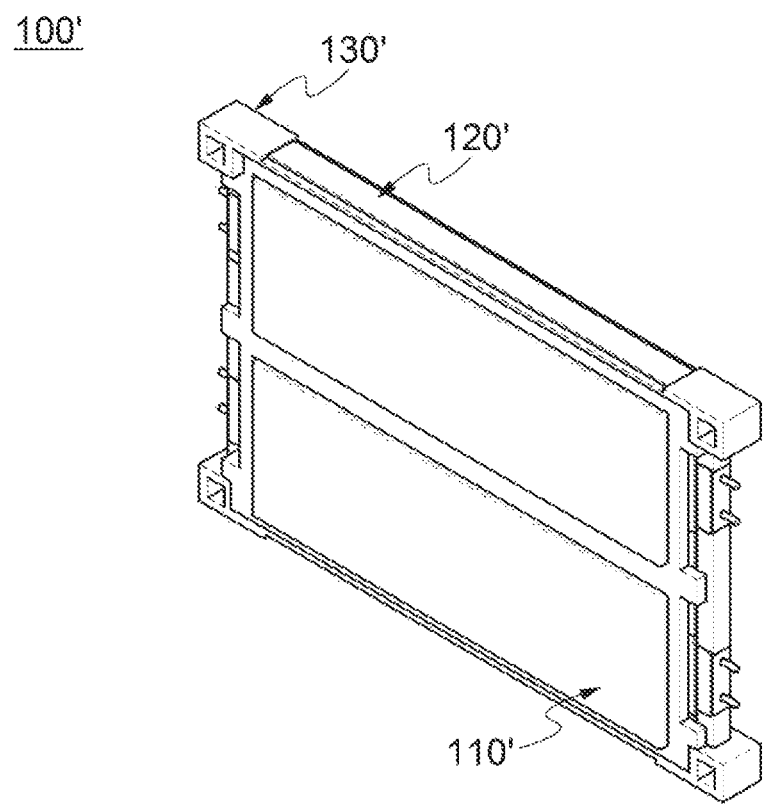
FIG. 13 is a perspective view illustrating the battery submodule included in the battery module of the battery rack according to another embodiment of the present invention.

FIG. 12 is an exploded perspective view of a battery submodule 100' included in a battery module 10' of a battery rack according to another embodiment of the present invention, and FIG. 13 is a perspective view illustrating a battery submodule 100' included in the battery module 10' of the battery rack according to another embodiment of the present invention.

Referring to FIGS. 12 and 13, a plurality of battery cells 110' of the battery module 10' included in the battery rack according to another embodiment of the present invention may be formed as a bidirectional polarity battery cell 110' having two electrode tabs (112') each of which protrudes from both sides of a cell body 111', not the unidirectional polarity battery cells 110 having two electrode taps (112) which protrude from one side of the cell body 111. At this time, a structure, in which the cooling member 120 and the battery cell 110' are in contact with each other, may be fixed and supported by a fixing frame 130' formed by coupling a first fixing frame 131' and a second fixing frame 132'.

Specifically, the plurality of battery cells 110' forming the battery submodule 100' may be formed as the bidirectional polarity battery cell 110'. Accordingly, at least one cooling member 120' and the battery cells 110' which are in contact with one side of the cooling member 120' may be arranged side by side on upper and lower sides in a direction in which the battery submodules 100' are stacked. At this time, in a case of the cooling member 120' in contact with the bidirectional polarity battery cell 110', an exposed part 122' may be formed only on one side rather than the exposed part 122' formed on the upper and lower sides of one cooling member 120'. At least two cooling members 120' may be located above and below the battery submodule 100'. The exposed part 122' of at least one cooling member 120' may form the upper and lower surfaces of the battery module 10'.

However, even when the exposed part 122' of the cooling member 120' is formed only on one side, since a length of the bidirectional polarity battery cell 110' is formed twice the length of the unidirectional polarity battery cell 110, the size of the exposed part 122' of the cooling member 120' in contact with the unidirectional polarity battery cell 110 may also be formed twice the size of the exposed part 122 of the cooling member 120. In addition, since exposed areas of the exposed parts 122 and 122' of the cooling members 120 and 120' per unit battery cell 110 and 110' are similar to the above description, the cooling effect obtained by the cooling member 120' is also similar to that of the battery rack 1 according to the embodiment of the present invention.

Contacting, cooling, and like of the cooling member 120' and the battery cell 110' are the same as those of the unidirectional polarity battery cell 110 of the battery rack 1 according to the embodiment of the present invention, and therefore will not be described in detail.

Figure 14:
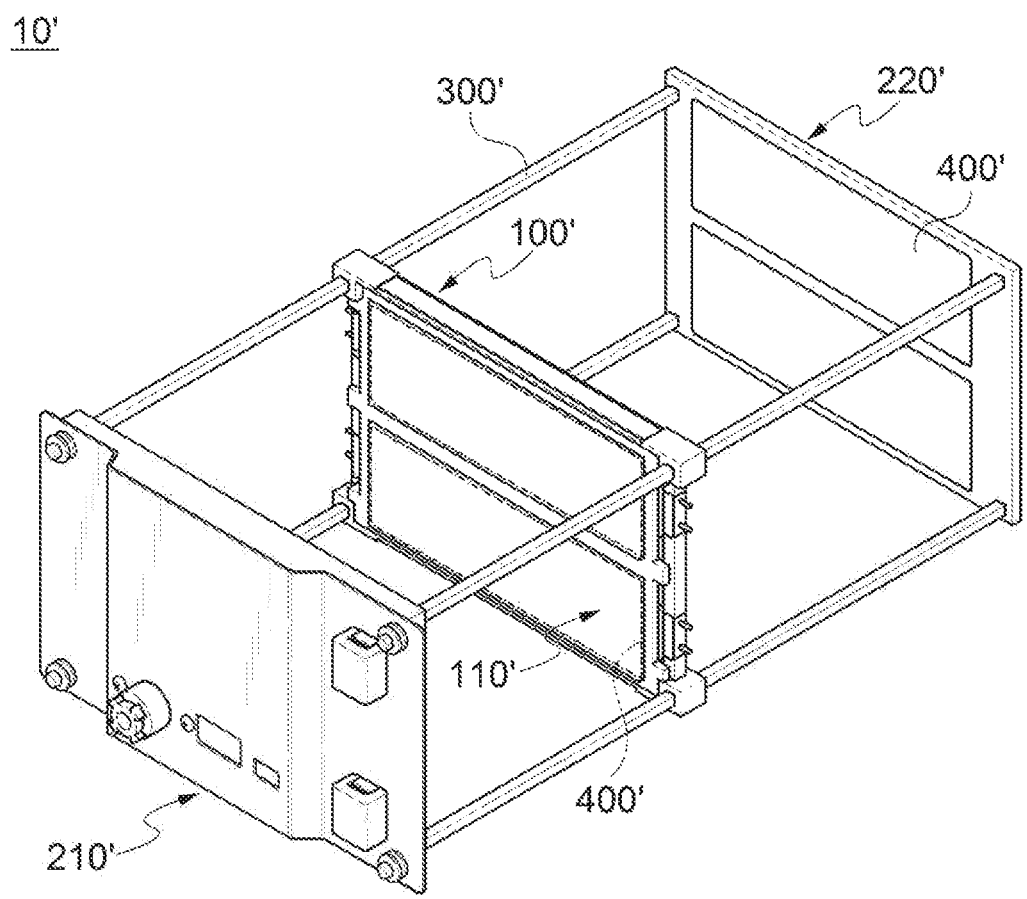
FIG. 14 is a perspective view illustrating a state in which the battery submodule and a fixed beam are coupled in the battery module of the battery rack according to another embodiment of the present invention.
Figure 15:
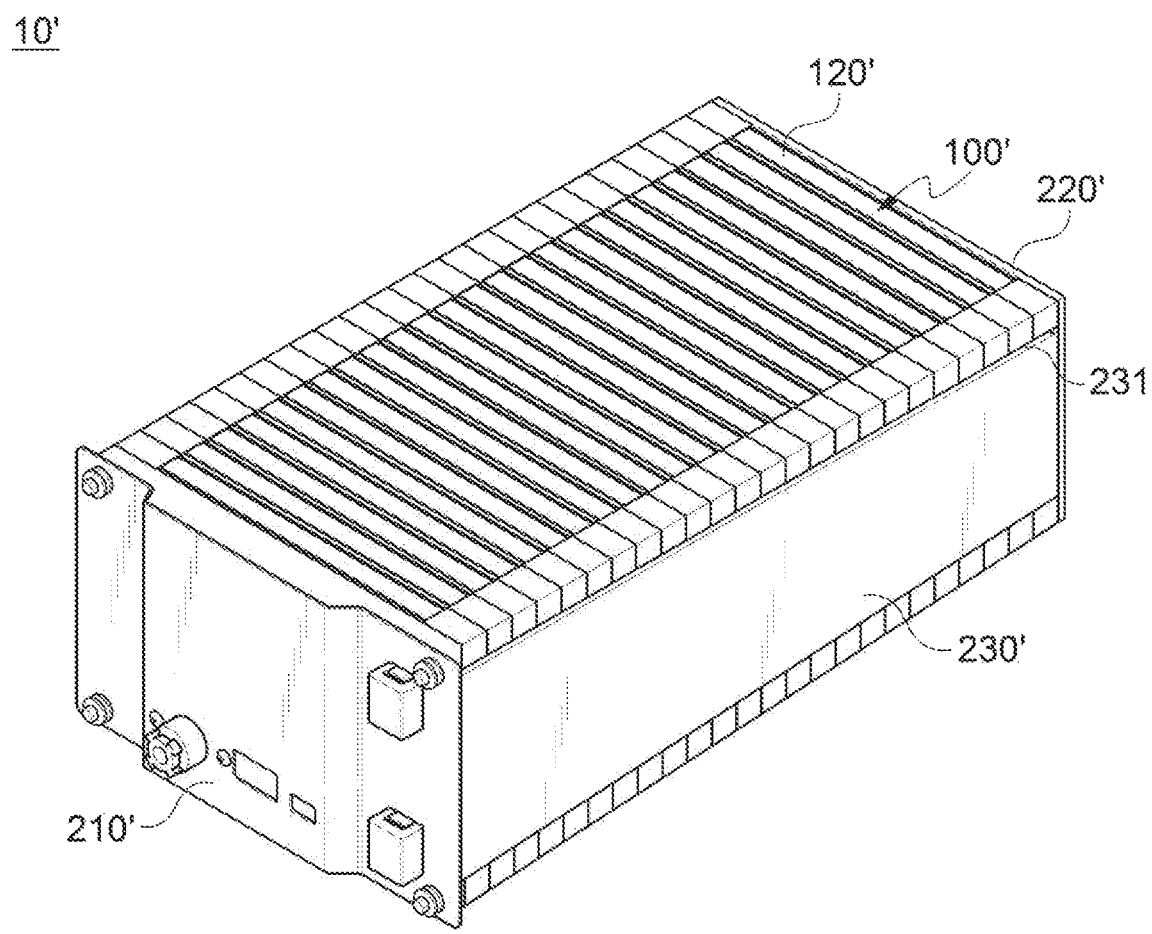
FIG. 15 is a perspective view illustrating the battery module of the battery rack according to another embodiment of the present invention.

FIG. 14 is a perspective view illustrating a state in which the battery submodule 100' and a fixed beam 300' are coupled in the battery module 10' of the battery rack according to another embodiment of the present invention, and FIG. 15 is a perspective view illustrating a battery module 10' of the battery rack according to another embodiment of the present invention.

Referring to FIGS. 14 and 15, the plurality of battery submodules 100' may be structurally fixed and supported by the fixed beam 300'. At this time, as in the case of the battery rack 1 according to the embodiment of the present invention, elastic pads 400' are interposed between every battery submodules 100' or between every two bundles of the battery submodules 100', thereby it is possible to prevent the plurality of battery cells 110' from being expanded.

As described above, the structure and shape for forming the battery module 10' by fixing the plurality of battery submodules 100' are the same as those of the battery rack 1 according to the embodiment of the present invention, and therefore will not be described in detail.

Meanwhile, the plurality of battery submodules 100' of the battery rack according to another embodiment of the present invention may also be electrically connected to each other by a bus bar assembly 520'. At this time, in the battery module 10' of the battery rack according to another embodiment of the present invention, the battery submodule 100' includes the bidirectional polarity battery cell 110', such that the plurality of battery cells 110' located at the upper side in the drawings may be connected to each other in series, and the plurality of battery cells 110' located on the lower side in the drawing may also be connected to each other in series, thus to be electrically connected with each other through the same configuration as the module bus bar 223.

Meanwhile, the features of a front cover unit 210', a rear cover unit 220', and side cover units 230' of the battery module 10' and the cooling method of the battery rack according to another embodiment of the present invention are the same as those of the battery rack 1 according to the embodiment of the present invention, and therefore will not be described in detail.

Although the representative embodiments of the present invention have been described in detail, it will be understood by persons who have a common knowledge in the technical field to which the present invention pertains that various modifications and variations may be made therein without departing from the scope of the present invention. Accordingly, the scope of the present invention should not be limited to the embodiments, but be defined by the appended claims as well as equivalents thereof.

DESCRIPTION OF REFERENCE NUMERALS

1: Battery rack
10, 10': Battery module
11: First terminal
12: Second terminal
20: Housing
21: Closed surface
30: Connecting member
40: Cooling fan
50: Rack controller
100, 100': Battery submodule
110, 110': Battery cell
111, 111': Cell body
112, 112': Electrode tab
120, 120': Cooling member
121, 121': Contact part
122, 122': Exposed part
130, 130': Fixing frame
131, 131': First fixing frame
1310: Terminal part
1311: Fastening pin
132, 132': Second fixing frame
133: Beam insertion hole
200: Protective cover unit
210, 210': Front cover unit
211: Front plate
212: Front cover member
213: High voltage connecting member
214: BMS module
215: MSD module
220, 220': Rear cover unit
221: Rear plate
222: Rear cover member
223: Module bus bar
230, 230': Side cover unit
231: Grip groove
300, 300': Fixed beam
400, 400': Elastic pad
510: First bus bar
520: Bus bar assembly
521: Second bus bar
5210: Fastening hole
522: Bus bar frame
530: Circuit unit
600: Latch screw
610: Latch groove
$d_1$, $d_{11}$, $d_{12}$, $d_{13}$, $d_{14}$, $d_{15}$, $d_{16}$, $d_{17}$: Distance between battery modules in stacking direction
$d_2$: Distance between back surface of housing and back surface of battery module

What is claimed is:

1. A battery rack comprising:
a housing; and
a plurality of battery modules stacked inside the housing, each battery module having a plurality of battery submodules stacked next to each other;
wherein each of the plurality of battery submodules comprises a fixing frame, the fixing frame comprising:
a first fixing frame configured to fix and support at least two cooling members arranged in a direction perpendicular to a direction in which the plurality of battery submodules are stacked;
a second fixing frame configured to be coupled with the first fixing frame so as to support at least two battery cells arranged in the direction perpendicular to the direction in which the plurality of battery submodules are stacked, and
wherein each of the at least two cooling members includes a contact part which contacts a corresponding one of the at least two battery cells and an exposed part which is exposed to ambient for disposing heat generated from the corresponding one of the at least two battery cells via the contact part and the exposed part to the ambient.

2. The battery rack according to claim 1,
the exposed part extends from at least one end of the contact part at a predetermined angle with respect to the contact part.

3. The battery rack according to claim 2, wherein the exposed parts are exposed to at least one surface of each of the plurality of battery modules.

4. The battery rack according to claim 1, wherein the number of the cooling members corresponds to the number of battery cells which are in contact with one side of the at least one cooling member of the plurality of battery cells.

5. The battery rack according to claim 1, wherein the fixing frame is configured to fix and support the at least two cooling members and the at least two battery cells.

6. The battery rack according to claim 1, wherein each of the plurality of battery modules comprises at least one fixed beam configured to fix and support the plurality of stacked battery submodules.

7. The battery rack according to claim 1, wherein each of the plurality of battery modules further comprises a protective cover unit configured to protect the plurality of stacked battery submodules, and
the protective cover unit comprises a front cover unit and a rear cover unit, which are located on both sides among outer surfaces of the plurality of battery submodules in a direction in which the plurality of battery submodules are stacked, and side cover units located on sides from which electrode tabs of the battery submodules protrude.

8. The battery rack according to claim 7, wherein each of the plurality of battery modules comprises at least one latch screw which is coupled to the front cover unit and includes a latch groove formed by cutting away at least a part of an outer peripheral surface thereof inward.

9. The battery rack according to claim 7, wherein each of the plurality of battery modules comprises a grip groove formed by cutting away at least a part of the side cover unit toward the battery submodule.

10. The battery rack according to claim 1, wherein each of the plurality of battery modules comprises elastic pads each of which is interposed between one or more battery submodules adjacent to each other in the plurality of battery submodules.

11. The battery rack according to claim 1, further comprising: a cooling fan located at an upper or a lower side of the plurality of stacked battery modules to dissipate heat generated from the plurality of battery modules.

12. The battery rack according to claim 11, wherein the plurality of battery modules are stacked at a predetermined distance, and
the predetermined distance is gradually increased from one side of the upper and lower sides, in which the cooling fan is located, toward the other side.

13. The battery rack according to claim 11, wherein the cooling fan is located at one side of the direction in which the battery submodules are stacked at the upper or lower side of the plurality of stacked battery modules, and
a closed surface on a side, in which the cooling fan is located among peripheral surfaces perpendicular to the direction in which the plurality of battery modules are stacked, is spaced apart from the plurality of battery modules at a predetermined distance.

14. The battery rack according to claim 1, wherein battery cells facing each other of the plurality of battery cells on both sides of the at least one cooling member in each of the battery submodules are connected to each other in series or in parallel, and
the plurality of battery submodules in each of the battery modules are connected to each other in series or parallel to.

* * * * *